United States Patent [19]
Jordan et al.

[11] Patent Number: 5,293,123
[45] Date of Patent: Mar. 8, 1994

[54] PSEUDO-RANDOM SCAN TEST APPARATUS

[75] Inventors: Albert Jordan, Mountain View; Peter L. Fu, Sunnyvale; David J. Garcia, San Jose, all of Calif.

[73] Assignee: Tandem Computers Incorporated, Cupertino, Calif.

[21] Appl. No.: 939,964

[22] Filed: Sep. 4, 1992

Related U.S. Application Data

[63] Continuation of Ser. No. 600,384, Oct. 19, 1990, abandoned.

[51] Int. Cl.⁵ .................................. G01R 31/28
[52] U.S. Cl. ........................ 324/158 R; 371/22.1; 371/22.3
[58] Field of Search ............... 324/158, 158 R, 158 T, 324/73.1, 95, 103 P; 371/21.3, 22.3, 22.1, 22.6, 27

[56] References Cited

U.S. PATENT DOCUMENTS

| | | | |
|---|---|---|---|
| 3,829,770 | 8/1974 | Stevens | 324/95 |
| 4,216,539 | 8/1980 | Raymond et al. | 371/20 |
| 4,441,074 | 4/1984 | Bockett-Pugh | 324/73 |
| 4,455,654 | 6/1984 | Bhaskar et al. | 371/16.2 |
| 4,546,313 | 10/1985 | Moyer | 324/103 P |
| 4,583,223 | 4/1986 | Inoue et al. | 324/73.1 |
| 4,682,330 | 7/1987 | Millham | 371/27 |
| 4,703,484 | 12/1985 | Rolfe et al. | 371/22.3 |
| 4,718,065 | 1/1988 | Boyle et al. | 371/25 |
| 4,763,066 | 8/1988 | Yeung | 324/73 |
| 4,764,925 | 8/1988 | Grimes et al. | 371/27 |
| 4,768,195 | 8/1988 | Stoner et al. | 371/25 |
| 4,768,196 | 8/1988 | Jou et al. | 371/25 |
| 4,817,093 | 3/1989 | Jacobs et al. | 371/25 |
| 4,827,476 | 5/1989 | Garcia | 371/21.1 |
| 4,835,458 | 5/1989 | Kim | 324/73 |
| 4,875,003 | 10/1989 | Burke | 371/25.1 |
| 4,879,717 | 11/1989 | Sauerwald et al. | 371/22.3 |
| 4,907,230 | 3/1990 | Heller et al. | 371/22.1 |
| 5,012,185 | 4/1991 | Ohfuji | 324/158 R |
| 5,032,783 | 7/1991 | Hwang et al. | 324/158 R |
| 5,068,599 | 11/1991 | Niehaus | 324/158 T |
| 5,068,604 | 11/1991 | Van de Lagemaat | 324/158 T |
| 5,072,175 | 12/1991 | Marek | 324/158 T |

*Primary Examiner*—Ernest F. Karlsen
*Attorney, Agent, or Firm*—Townsend and Townsend Khourie and Crew

[57] ABSTRACT

Disclosed is a circuit configuration that permits the monitoring of the operation of an input/output circuit of a digital unit under test by pseudo-random scan test techniques. A resistive element couples test signals to an input/output terminal of the device under test to which the input/output circuit is connected. The connection between the resistive element and the terminal is monitored during pseudo-random scan testing, permitting testing of the input/output circuitry.

6 Claims, 1 Drawing Sheet

PSEUDO-RANDOM SCAN TEST APPARATUS

This is a continuation of application Ser. No. 07/600,384 filed Oct. 19, 1990, now abandoned.

BACKGROUND OF THE INVENTION

The present invention relates to the testing of digital circuits and systems in using pseudo-random scan test techniques, and particularly to the capability of checking the operability of the input/output circuits of such circuits and systems during the test period.

Recent advances in the art of semiconductor circuit fabrication, particularly in the area of manufacturing components for digital computer systems, have seen a significant increase in the amount of circuitry that can be formed on any given area of semiconductor. In addition, while circuit density per semiconductor area has increased, chip size (i.e., the semiconductor area available for holding the circuitry) has also increased, resulting in integrated circuit chips carrying an enormous amount of digital circuitry. These are often termed large-scale integrated (LSI) or very large-scale integrated (VLSI) circuitry.

Earlier in the chronological development of integrated circuits, testing was relatively straightforward: Known test signals were applied to the inputs of the circuit, varied, and the outputs monitored. On the simpler, less integrated circuitry then available, this technique was easy to use, and proved quite useful. However, as integrated circuit densities increased, including the number of elemental storage units (e.g., latches, flip-flops, registers and the like) more sophisticated techniques became necessary.

One such technique in use today is referred to as pseudo-random "scan testing." This technique requires the elemental memory units forming a part of the integrated circuit to be designed to selectively function in one of two modes: A first or "normal" mode in which they operate as primarily designed, i.e., flip-flop or register; and a second, "test" mode in which a number of the elemental memory stages are connected in series to form one or more extended shift registers or, as they are more commonly called, "scan lines." Pseudo-random bit patterns are then scanned (loaded) into the scan lines, the system under test allowed to operate in its normal configuration for one clock time, and the system returned to its test state so the content of the scan lines scanned (shifted) out and analyzed (usually by comparing it to known or standard patterns). The operability of the tested system is thereby established. Examples of the foregoing may be found in U.S. Pat. Nos. 4,718,065, 4,534,028, and 4,827,476.

Pseudo-random scan testing to which the present invention is directed, as the term implies, involves applying pseudo-random patterns to any input circuits of the system under test, and monitoring the output of any output circuits. While this technique of testing provides many benefits, such as a cost effective test method without need to form special test vectors in advance, there are problems. One such problem is the difficulty, if not inability, to predict in advance the state that certain input/output circuits will assume during testing. For example, certain circuits of the system under test may be capable of operating in one of two modes: Input or output. To date, insofar as is known, pseudo-random scan test techniques do not provide complete confidence that portions of such input/output circuit are tested. The reason stems from the inability to easily predict the input-output direction of the circuit; during scan test time bit patterns (which, it will be remembered, are pseudo-random) must be supplied to the input section, and the output section monitored. Since, during the test period, there is usually no easy way to know what state (i.e., input or output) the input/output circuit will be, applying a test signal at the same time the input-/output circuit is functioning as an output produces indeterminate results. For example, assume the tester applies a logic ZERO while the input/output circuit is in an output mode of operation, providing a logic ONE. The monitored voltage at the terminal pin connected to the input/output circuit may read a logic Zero at one time, a logic ONE at an other time; that is, it is never certain that a logic ONE or ZERO will appear under such conditions.

This uncertainty has resulted in such dual-function circuits not being completely tested.

Accordingly, there is a need for including in scan test techniques a methodology that can also monitor and check the operability of such dual-function input/output circuitry.

SUMMARY OF THE INVENTION

Accordingly, there is provided by the present invention a technique that permits testing of dual-function input/output circuits of a digital integrated circuit or system tested by pseudo-random scan test methodology. In addition, the invention permits use of pseudo-random testing of input-output circuitry without resort to attempting to predict what state (e.g., input or output) the circuitry will take, saving test development time by obviating the need to predict or determine, in advance, the state (input or output) of input-output circuitry. The invention is simple and inexpensive to implement and effective in its ability to ensure the operability of such input/output circuitry.

According to the preferred embodiment of the invention, an output terminal of a tester is coupled by a resistive element to the input/output terminal of a system under test (hereinafter "device under test" or "DUT") to which an input/output circuit of the system is connected. A receiver element has an input coupled to the input/output terminal to receive and monitor the signaling appearing thereat.

In operation, the DUT is subjected to pseudo-random scan testing. During such testing, when the DUT's input/output circuit is in an input state, the input/output terminal will assume a digital state determined by output signal produced by the test system. When, however, the input/output circuit is in an output state, and the test system and input/output circuit both attempt to drive the terminal, the impedance ensures the signal (voltage level) produced by the input/output circuit will dominate. Thereby, the output section of the input-/output circuit is monitored.

It is known that certain devices carrying digital circuitry of the type to which the present invention is directed to testing, does provide separate output terminals that carries signals indicating whether an associated input/output (I/O) terminal is functioning as an output terminal or an input terminal. This indication of the state of the I/O terminal can, of course be used to drive/monitor the terminal accordingly. However, this technique relies upon the integrity of these separate output terminals and the state signals produced thereat, as well as the associated circuitry. The approach of the present invention provides a more complete test, and goes further by providing a technique for fault isolation.

Pursuant to the present invention, the operational capabilities of input/output circuitry can be determined during scan tests of digital systems.

This and other advantages and aspects of the invention will become apparent to those skilled in the art upon a reading of the following detailed description of the invention, which should be taken in conjunction with the accompanying drawings.

DETAILED DESCRIPTION OF THE INVENTION

Figure 1:
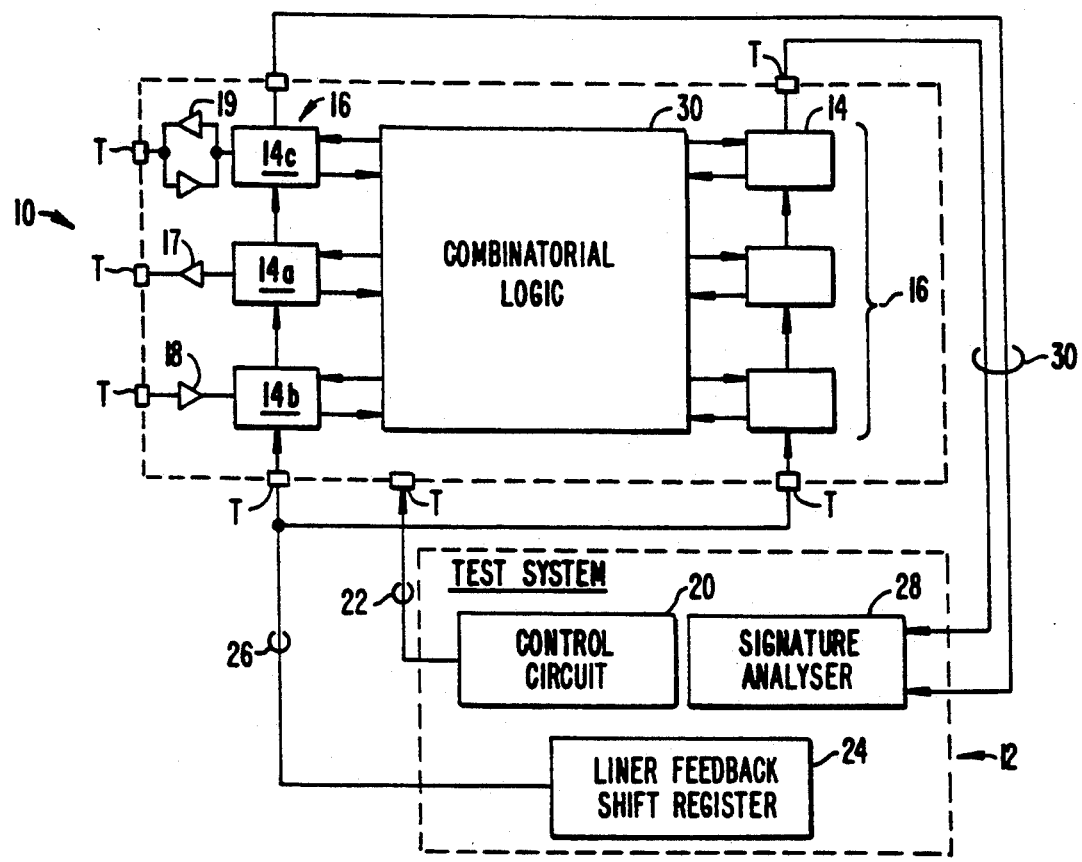
FIG. 1 is a diagrammatic illustration of prior art scan test methodology.

Turning now to the drawings, and referring first to FIG. 1, there is illustrated in simplified construction implementation of prior art scan test techniques. As shown in FIG. 1, a device under test (DUT), designated generally with the reference numeral 10, is connected to a test system 12. The DUT 10 can be an integrated circuit chip, or a larger digital system. Whatever the implementation of the DUT 10, it will be designed to include a number of elemental storage units 14 designed to operate in the two modes indicated above: A normal mode, in which the elemental storage unit 14 functions in a capacity for which it is principally designed (e.g., flip-flop, latch, etc.), and a test mode in which the individual elemental storage units 14 are connected to form one or more scan lines 16.

As FIG. 1 further illustrates, the DUT 10 may have various signal communicating paths to the outside world, here shown as an output circuit 17 that communicates one of the elemental storage units 14 (here, 14a) to a terminal T. Likewise, an input circuit 18 communicates signaling applied to a terminal T to the elemental storage unit designated 14b. Finally, the elemental storage unit designated 14c is coupled to a terminal T of the DUT by an input/output circuit 19. Whereas the output circuit 17 and the input circuit 18 function in one mode only, i.e., output and input, respectively, the input/output circuit is capable of functioning as either input circuit or an output circuit, but usually not both. Typically, control signaling will be used to place the input-/output circuit in one of its two modes of operation: Input or output.

Digressing, the circuits used to communicate with the outside world, e.g., output circuit 17, input circuit 18, and input/output circuit 19, are shown here as being coupled to elemental latch units 14a–14c for illustrative purpose only. It will be appreciated that it is just as likely that such circuits may be coupled to various elemental storage units, if at all, through passive (combinatorial) logic (not shown).

The test system 12 typically contains control circuit 20 for generating control signals that are communicated to the DUT 10 by a control bus 22. The control signals, among other things, control the mode of operation (i.e., normal or test) of the elemental storage units 14, effecting formation of the scan lines 16 when in a test state.

The test system 12 also, broadly, includes a linear feedback shift register (LSFR) 24 for generating a pseudo-random test pattern communicated to the scan chains 16 via an input bus 26.

Finally, the test system 12 will include some form of signal analyzer 28 to receive the test patterns after they have been passed through the DUT 10, via an output bus 32.

In practice, the control circuit 20 of the test system 12 will issue control signals that, when received by the DUT 10, cause the elemental storage units 14 to reconfigure themselves into the scan lines 16. The LSFR 24 will generate a pseudo-random test pattern that is shifted ("scanned") into the now-formed scan lines 16, placing the DUT in a pseudo-random state. Control signals switch the elemental storage units 14 to their normal state, and the DUT allowed to operate for one clock period, permitting the data to pass from the elemental storage units through various combinatorial logic 30, and received by others of the elemental storage units 14. The elemental storage units 14 are then switched back to their scan line configuration and the content of the scan lines shifted out for receipt by the signature analyzer 28, while at the same time a new pseudo-random test pattern is generated by the linear feedback shift register 24 and scanned into the scan lines 16.

This process is repeated a number of times (e.g., 65,536 or 64K) to generate a "signature" indicative of the operating state of the DUT 10. The signature is then compared to one produced by testing a known operable board. If the signature matches, the DUT 10 is considered operable; if the signatures do not match, the DUT is considered inoperable, and subjected to further tests.

During testing the output of the output circuit 17 is monitored, and either combined with the signature produced by the scan lines 16, or used to form an independent signature indicative of that (and perhaps other) output circuit. Also, during the time the DUT is between scan states, pseudo-random signaling is applied to the input circuit 18 as input to the DUT 10, forming a part of the signature ultimately produced. In this manner the output and input circuits 17, 18 are tested.

However, known prior art pseudo-random test techniques were not capable of fully checking the input/output circuit 19. For that reason the present invention is provided.

Figure 2:
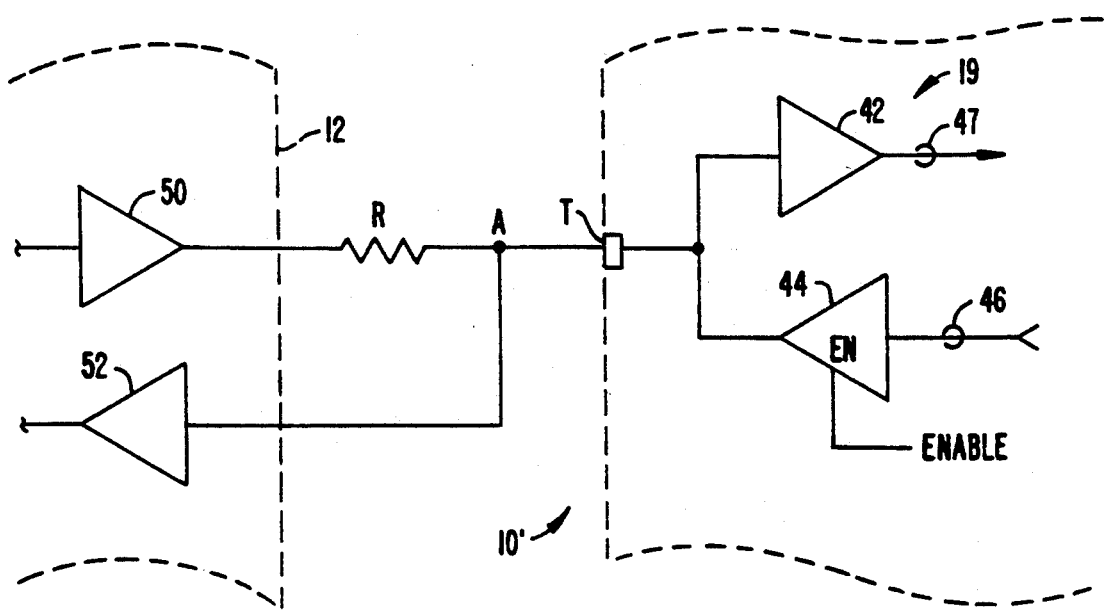
FIG. 2 illustrates the circuitry used to implement the present invention to test input/output circuitry of a device under test (DUT) by pseudo-random scan test methodology.

This is better illustrated in FIG. 2 which shows a small portion 10' of the DUT 10, carrying the input-/output circuit 19. As FIG. 2 shows, the input/output circuit 19 comprises a receiver 42, having an input that connects to the terminal T, and an output driver 44, whose output also connects to the terminal T. The input/output circuit 19 is capable of providing both input and output capability to the terminal T. Data is communicated from the chip via the input/output circuit 19 by assertion of an enable signal (ENABLE) to place the output driver 44 in an operating state. With ENABLE asserted, data is communicated from the output bus line 46 (internal to the DUT 10), through the driver 44, to the terminal T. Conversely, deasserting ENABLE switches the mode of the input/output circuit 19, placing the output driver 44 in a high-impedance state, and permitting the receiver 42 to communicate signaling from the terminal T to the interior input bus line 47.

Typically, the test system will include driver circuits for communicating test signals to the DUT 10 such as, for example, the driver circuit 50. As indicated, because it cannot be known in advance what state the ENABLE signal will take when the DUT 10 is placed in a pseudo-random state, it may well be that at any moment in time both the driver circuit 50 of the test system 12 and the output circuit 44 of the DUT 10 will be driving the terminal T.

It is the operation of the output driver 44 that is desired to be monitored, not the output of the driver circuit 50. Accordingly, a resistance R is placed to communicate the output of the driver circuit 50 of the test system 12 to the terminal T. The value of the resistance R is determined by the operating characteristics of the driver 50, the driver 44, and the receiver 42 as follows: Take first the condition of the output driver 44 applying a logic ZERO (e.g., zero volts) and the driver circuit 50 provides a positive voltage representative of a logic ONE. The voltage at terminal T should be at a level at least representative of the output of the output driver 44. Thus, using Kirchoff's voltage law:

$$E_2 = E_1 - IR \quad (1)$$

where $E_1$ = voltage produced by driver circuit 50,
$E_2$ = voltage produced by output driver 44; and
$I$ = current sourced by driver circuit 50.

The relationship (1) is used in the case of the driver 44 enabled and driving the terminal T with a ZERO. It also assumes that the input currents to the receivers 42 and 52 the latter being used in the test device for monitoring the signal state at terminal T during testing) are very small. The specification sheets will provide one with the values of $E_{2(max)}$, the maximum allowable voltage for a logic ZERO for output driver 44; $E_{1(min)}$, the minimum allowable voltage for a logic ONE for driver circuit 50; and I, the current at $E_{1(min)}$.

Having determined a value for R under the conditions set forth above (output driver 44 at logic ZERO, driver circuit 50 at logic ONE), the conditions are reversed to see if, with this value of R, driver 44 is capable of sourcing sufficient current for maintaining the voltage levels $E_2$ and $E_1$ at correct levels. Thus, output driver 44 is set to drive a logic ONE and driver circuit 50 is set to drive a logic ZERO. The voltage at the terminal T is then checked to see if it is representative of a logic ONE. If not, the value of R is adjusted to find one sufficient.

As indicated above, the receiver 52 is provided to monitor the signaling at the terminal T. As FIG. 2 indicates, the input to the receiver 52 is connected to the node A, located between the resistance R and the terminal T. The resistance ensures a proper voltage value at the node A.

During pseudo-random testing, the output of the receiver circuit 52 of the tester system 12 is used to develop a signature indicative of the output driver 44 of the DUT 10, and compared to a known standard signature indicative of operability.

It will be appreciated by those skilled in the art that the circuitry illustrated in FIG. 2 can be replicated for each of the input/output terminals T of the DUT 10, each being monitored to develop their own signatures which provide an indication of the operability of each of the input/output circuits 40 associated with the terminal T.

In conclusion, therefore, there has been disclosed a methodology for determining the operability of input-/output circuitry of a device under test during pseudo-random scan testing. By using an impedance (i.e., resistive element), the voltage appearing at the input/output terminal will be that produced by the associated input-/output circuitry 40.

What is claimed is:

1. In a system for performing pseudo-random testing of a digital device, the digital device having input/output terminals and an input/output circuit means coupled to at least one of the input/output terminals, the input/output circuit means being operable in a first mode for receiving a digital input signal and in a second mode for applying a digital output signal to the one input/output terminal, apparatus for monitoring the input/output circuit means during pseudo-random testing of the digital device, the apparatus comprising:
   output means for providing a digital test signal;
   impedance means for coupling the digital test signal to the one input/output terminal, the impedance means having an impedance value such that when the input/output circuit means is in the second mode, and, at the same time, the digital test signal is applied to the one input/output terminal, the digital output signal dominates to produce a representative signal indicative of the digital output signal at the one input/output terminal; and
   monitoring means coupled to receive the digital test signal or the representative signal appearing at the one input/output terminal.

2. The apparatus of claim 1, wherein the impedance means is substantially resistive.

3. The apparatus of claim 1, including configuration means for communicating test signals from the system to the input/output terminals, and wherein the impedance means is mounted on the configuration means.

4. The apparatus of claim 3, wherein the impedance means is substantially a resistance.

5. The apparatus of claim 1, wherein the monitoring means includes amplifier means coupled to receive signals appearing at the one input/output terminal.

6. Apparatus for monitoring operation of an input-/output circuit coupled to an input/output terminal of a digital device under test by pseudo-random testing, the input/output circuit being operable in a first mode for receipt of an input signal at the input/output terminal, and in a second mode for applying an output signal to the input/output terminal, the apparatus comprising:
   output means for providing a test signal;
   resistance means coupling the output means to the input/output terminal, the resistance means having a value sufficient to permit the output signal to predominate at the input/output terminal when both the output means and the input/output circuit are providing the test signal and the output signal, respectively, to the input/output terminal; and
   input means coupled to receive the test signal or the output signal appearing at the input/output terminal.

* * * * *